(12) United States Patent  (10) Patent No.: US 7,418,244 B2
Montalvo  (45) Date of Patent: Aug. 26, 2008

(54) RADIO TRANSMITTER WITH ACCURATE POWER CONTROL

(75) Inventor: Antonio J. Montalvo, Raleigh, NC (US)

(73) Assignee: Analog Devices, Inc., Norwood, MA (US)

( * ) Notice: Subject to any disclaimer, the term of this patent is extended or adjusted under 35 U.S.C. 154(b) by 595 days.

(21) Appl. No.: 10/633,713

(22) Filed: Aug. 4, 2003

(65) Prior Publication Data

US 2005/0032487 A1 Feb. 10, 2005

(51) Int. Cl.
H01Q 11/12 (2006.01)
H04B 1/04 (2006.01)

(52) U.S. Cl. ............. 455/127.2; 455/127.1; 455/127.3; 455/126; 455/522

(58) Field of Classification Search ............. 455/127.1, 455/127.2, 126, 127.5, 136, 138, 232.1, 69, 455/130, 127.3, 522, 234
See application file for complete search history.

(56) References Cited

U.S. PATENT DOCUMENTS

| 5,170,495 | A | * | 12/1992 | McNicol et al. ............. 455/116 |
| 5,381,108 | A | * | 1/1995 | Whitmarsh et al. ............ 330/2 |
| 5,485,486 | A | | 1/1996 | Gilhousen et al. ........... 375/205 |
| 5,574,992 | A | * | 11/1996 | Cygan et al. ................. 455/126 |
| 5,678,209 | A | * | 10/1997 | Strakovsky ................. 455/126 |
| 5,710,981 | A | * | 1/1998 | Kim et al. ..................... 455/69 |
| 5,748,678 | A | * | 5/1998 | Valentine et al. ............ 375/297 |
| 5,959,499 | A | * | 9/1999 | Khan et al. .................. 330/149 |
| 6,018,650 | A | * | 1/2000 | Petsko et al. ............. 455/234.1 |
| 6,337,974 | B1 | * | 1/2002 | Inamori et al. .............. 455/126 |
| 6,381,286 | B1 | | 4/2002 | Wilkinson et al. .......... 375/296 |
| 6,718,165 | B1 | * | 4/2004 | Ha .......................... 455/234.2 |
| 2002/0072329 | A1 | * | 6/2002 | Bandeira et al. ............... 455/7 |
| 2003/0220086 | A1 | * | 11/2003 | Birkett ....................... 455/260 |
| 2005/0048985 | A1 | * | 3/2005 | Haarsten ..................... 455/453 |
| 2006/0063497 | A1 | * | 3/2006 | Nielsen ....................... 455/118 |

FOREIGN PATENT DOCUMENTS

EP 0928072 A2 7/1999
WO WO 99/29047 10/1999

* cited by examiner

*Primary Examiner*—Tuan Pham
(74) *Attorney, Agent, or Firm*—Bromberg & Sunstein LLP

(57) ABSTRACT

A radio transmission power control circuit includes a radio frequency (rf) downconverter that produces a downconverter output representative of the difference between a first downconverter input based on a transmitted signal of a radio transmitter and a second downconverter input based on a local oscillator signal. A receiver baseband circuit processes the downconverter output to produce an analog power signal representative of the transmitted signal. A digital to analog converter converts the analog power signal to a representative digital power signal. A feedback control circuit produces a transmitter gain control signal to control transmitted signal power so as to minimize the difference between the digital power signal and a power reference signal.

24 Claims, 8 Drawing Sheets

RADIO TRANSMITTER WITH ACCURATE POWER CONTROL

FIELD OF THE INVENTION

The invention generally relates to radio transmitters, and more specifically to accurate control of the broadcast power of radio transmitters.

BACKGROUND ART

Accurate control of the power transmitted by a radio is important for a variety of reasons:
  Regulatory bodies, such as the FCC, limit the maximum power of radio transmissions.
  Transmitted output power level can have an uncertainty on the order of 10 dB without closed loop control.
  Radio link range is a function of transmitted power such that higher power results in a link that can be maintained over a longer distance.
  Accurately controlling the transmitted power to the minimum needed to maintain a link minimizes interference with other radios and minimizes power dissipation.

Most radio transmitters use some form of closed-loop control as shown in FIG. 1 to control output power. The transmitter is represented as a modulator 10, which outputs a modulated radio-frequency signal. The output of modulator 10 typically is amplified in multiple stages at least one of which is a variable-gain RF amplifier (VGA) 11, and another of which is a power amplifier (PA) 12. The output of PA 12 is then transmitted out antenna 13. A directional coupler 14 at the output of the PA 12 produces a power sensing signal that is proportional to the power transmitted by antenna 13. The power sensing signal is detected by the power detector 15 which produces a dc voltage proportional to the power sensing signal at its input. The output of power detector 15 is input to a feedback amplifier 16, which controls the gain of the VGA 11 to minimize the difference between the output of power detector 15 and a reference voltage input (Ref) to the feedback amplifier 16. The circuit shown in FIG. 1 may be part of a half-duplex transceiver in which the transmitter and the receiver alternately cycle such that they are not both on at the same time.

Power detector 15 is typically either a diode detector or a logarithmic amplifier. Diode detectors are inexpensive, but they have limited dynamic range (~20 dB) and suffer from temperature dependence. Logarithmic amplifiers can be very accurate, but their frequency range is limited. Present state-of-the-art logarithmic power detectors have a maximum frequency on the order of 2.5 GHz. That frequency can be increased, but only at the expense of increased power dissipation.

In addition, the analog closed-loop system shown in FIG. 1 is more complicated if the rf output from modulator 10 includes a varying modulation envelope, since the loop will attempt to regulate away the varying envelope. This effect can be addressed by using a partly digital loop which digitizes the output of power detector 15.

SUMMARY OF THE INVENTION

A representative embodiment of the present invention includes a radio transmission power control circuit in which a radio frequency (rf) downconverter that produces a downconverter output having a frequency equal to the frequency difference between a first downconverter input based on a transmitted signal of a radio transmitter and a second downconverter input based on a local oscillator signal. A receiver baseband circuit processes the downconverter output to produce a power signal representative of the transmitted signal. A feedback control circuit produces a transmitter gain control signal to control transmitted signal power so as to minimize the difference between the power signal and a power reference signal.

In a further embodiment, the circuit is part of a half-duplex radio transceiver also having a receiver circuit such that the receiver baseband circuit is used by the receiver when the radio transmitter is inactive, and wherein the local oscillator signal is used by the radio transmitter such that the transmitted signal has a frequency determined by the local oscillator signal.

An embodiment may also include an analog to digital converter that converts the power signal to a representative digital power signal such that the feedback control circuit produces the transmitter gain control signal so as to minimize the difference between the digital power signal and the power reference signal.

In other embodiments, the first downconverter input may be developed by a directional coupler that senses the transmitted signal. The radio transmitter may be part of a wireless local area network transceiver. In addition or alternatively, the radio transmitter may be part of a time division duplex system.

Embodiments of the present invention also include a method of controlling radio transmission power. A radio frequency (rf) downconverter output is produced having a frequency equal to the frequency difference between a first downconverter input based on a transmitted signal of a radio transmitter and a second downconverter input based on a local oscillator signal. The downconverter output is processed with a receiver baseband circuit to produce a power signal representative of the transmitted signal. A transmitter gain control signal is produced to control transmitted signal power so as to minimize the difference between the power signal and a power reference signal.

The radio transmitter may be part of a half-duplex radio transceiver also having a receiver circuit such that the receiver baseband circuit is used by the receiver circuit when the radio transmitter is inactive, and the local oscillator signal may be used by the radio transmitter such that the transmitted signal has a frequency determined by the local oscillator signal.

A method may further include converting the power signal to a representative digital power signal such that the transmitter gain control signal is produced so as to minimize the difference between the digital power signal and the power reference signal.

In any such a method, the first downconverter input may be developed by a directional coupler that senses the transmitted signal. The radio transmitter may be part of a wireless local area network transceiver and/or a time division duplex system.

BRIEF DESCRIPTION OF THE DRAWINGS

The present invention will be more readily understood by reference to the following detailed description taken with the accompanying drawings, in which.

DETAILED DESCRIPTION OF SPECIFIC EMBODIMENTS

Embodiments of the present invention are directed to techniques for accurate control of radio transmitter power. Some radio systems, for example time-division duplex (TDD) systems such as 802.11(a)(b)(g) wireless local area networks (WLAN's), use the same frequency for transmitting and receiving. In such systems, the receiver and the transmitter cannot be used at the same time. Embodiments of the present invention provide very accurate control of the transmitted power by utilizing the receiver base-band section, which is idle while transmitting, together with an RF downconverter with very accurate gain and a digital control block. Such an approach offers far more accurate power level control at lower cost. This results in increased range in the radio link, or lower power dissipation, or both.

In the specific instance of an 802.11(a)(b)(g) WLAN, the a-band frequency range of 4.9 to 5.9 GHz is too high for a practical logarithmic amplifier. And the power control range of 45 dB is too large for a diode detector. Because the 802.11 standard is a time-division duplex (TDD) system, the receiver and transmitter—which use the same frequency channel—are not used at the same time. Thus, a direct-conversion transmitter in which the transmit local oscillator (LO) is at the carrier frequency can use the receiver's baseband path during the transmit cycle.

Figure 1:
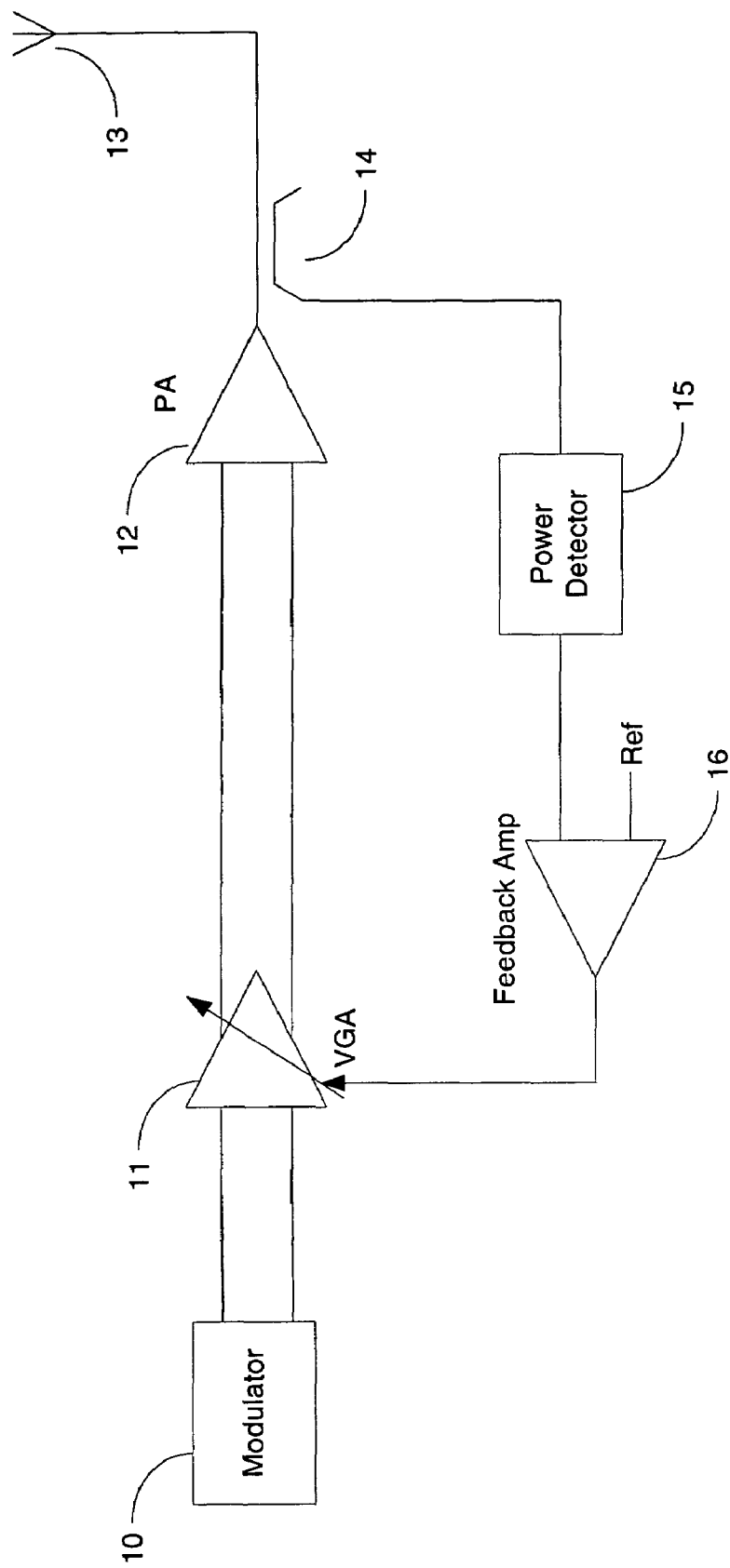
FIG. 1 shows a typical radio frequency transmitter having closed loop feedback control.
Figure 2:
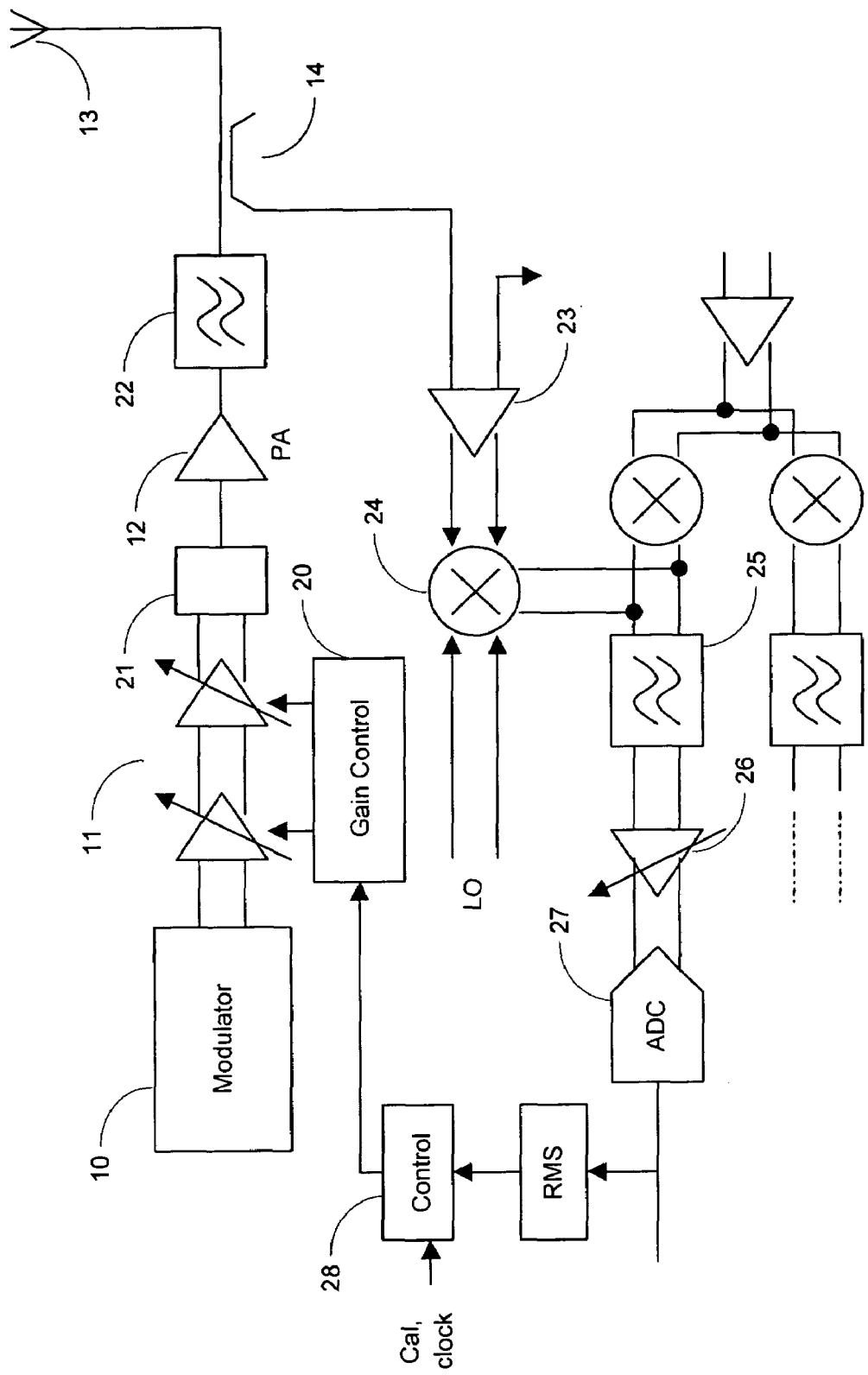
FIG. 2 shows functional blocks of a radio system according to one embodiment of the present invention.

FIG. 2 shows a block diagram of a radio system according to one embodiment of the present invention. As before, modulator 10 outputs a modulated rf signal, in this case, to a two-stage variable gain amplifier (VGA) 11. The output of VGA 11 is provided via transmit bandpass filter 21 to power amplifier (PA) 12, and from there via transmit output filter 22 out the antenna 13.

The transmitted rf output power is detected by a directional coupler 14, which drives a power detect downconverter stage comprised of a downconverter input amplifier 23 and power detect downconverter 24. In principle, the downconverter of the receiver could be used, but in practice it is not desirable to do so because the requirements for the receiver—low noise, high linearity and high gain—are not compatible with the requirements for the power detector which are temperature- and frequency-independent gain. It may be noted that the area of a modern RF IC tends to be dominated by inductors. Compared to the areas of the receiver and transmitter circuits, the area of the power detector downconverter stage is negligible.

The output of the power detect downconverter 24 is fed to one of the receiver's baseband paths where it is filtered by baseband filter 25 and amplified by baseband VGA 26 The output of baseband VGA 26 is digitized by control loop ADC 27. The digital output of ADC 27 is provided to control block 28, which together with gain control 20 generates a control signal for the transmitter VGA's 11 so as to minimize the difference between the digital power detect signal from the control loop ADC 27 and a reference cal signal input to control block 28.

The power detect signal from the directional coupler 14 to the downconverter input amplifier 23 is relatively large, on the order of −15 dBm in one specific implementation at maximum output power, so the downconverter stage does not need gain. In one specific embodiment, the gain of the downconverter input amplifier 24 is −6 dB, and the conversion gain of the downconverter 23 is −10 dB. Since the downconverter input amplifier 23 can have loss, a resistive load may be used with a very small resistance such that the bandwidth is very wide. This approach means that frequency dependence of the downconverter stage is very small even at very high frequency. In addition, resistively loaded circuits can be designed with a gain that is a function of the ratio of two resistors. The result is very predictable and constant gain which minimizes or even eliminates calibration requirements.

In one specific embodiment, the downconverter 24 has a transconductance of 3.2 milliSiemens, which results in a maximum gain of 19.7 dB when loaded by the variable transimpedance baseband VGA 26. The receiver baseband gain should be set so that the control loop ADC 27 does not clip under maximum input-level conditions and so that adequate signal-to-noise ratio (SNR) is maintained over all of the transmit output power range. The maximum input level at the input to the downconverter input amplifier 23 is designed to be −15 dBm. An additional 16 dB of headroom is added (10 dB for the peak-to-average, 3 dB for uncertainty in the detector path gain and another 3 dB for uncertainty in the coupler loss). Thus, the receiver baseband gain is set so that the input to control loop ADC 27 is 16 dB below the clipping level with a −15 dBm input power. This condition is met with the receiver baseband gain set to −9 dB. Operation gets close to the desired gain at about 30 dB below maximum gain.

Figure 6:
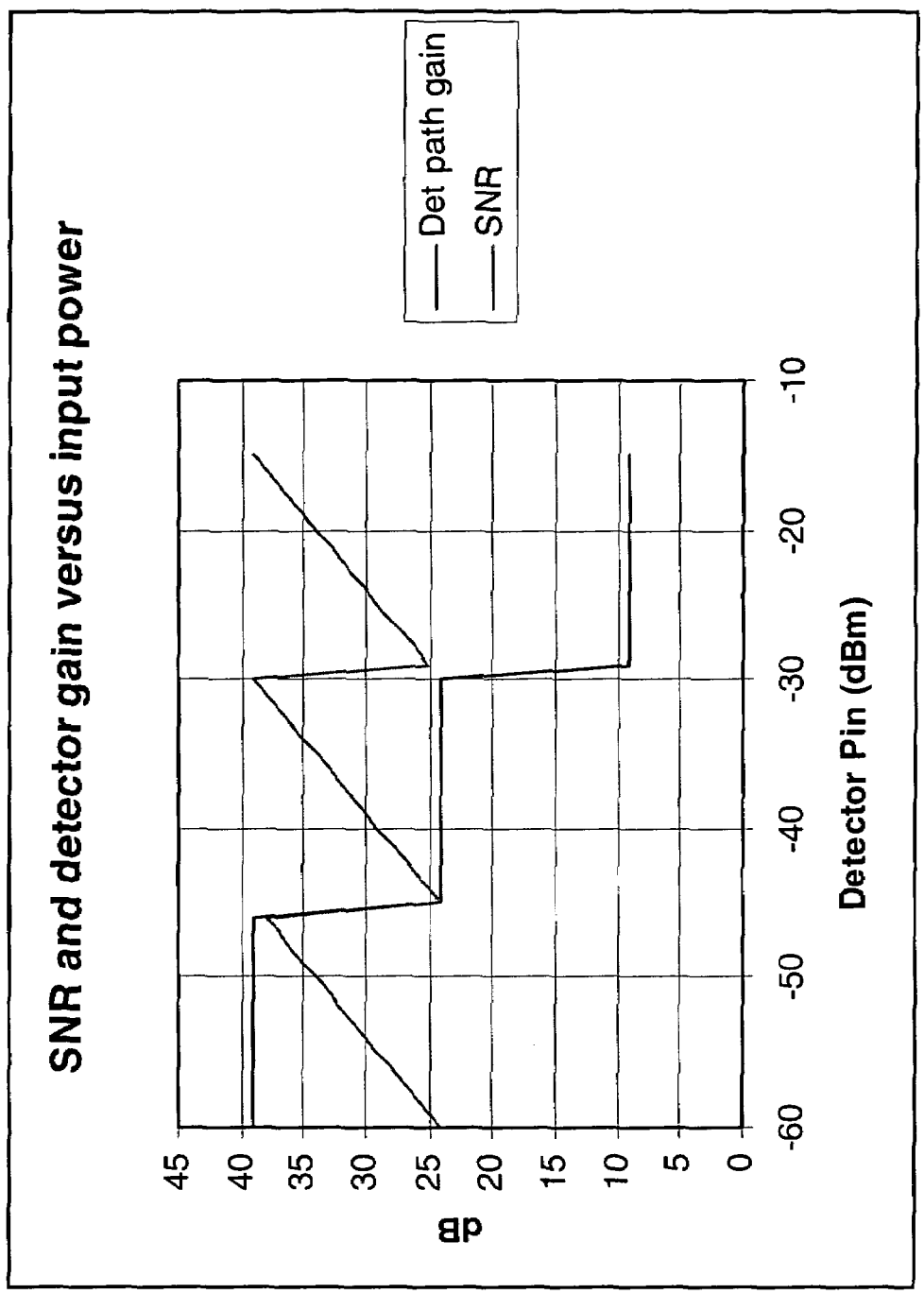
FIG. 6 shows a plot of signal-to-noise ratio of the detected power and detector path gain in comparison to output power for one embodiment.

As the output power is decreased, the SNR of the detected power is decreased as well. To ensure an accurate measure of transmitted power, SNR should be kept above about 20 dB nominally. A plot of SNR and detector-path gain versus output power for one specific embodiment is shown in FIG. 6. For every 15 dB of output power reduction the receiver baseband gain is increased by 15 dB in order to maintain adequate SNR. In order to implement the gain control as shown in FIG. 6, the power control loop needs to control receiver baseband gain during a transmit burst. Calculations for one specific embodiment suggest that the optimum initial setting for the receiver baseband gain is 30 dB below the maximum. It may be desirable to have the initial receiver baseband transmit burst gain setting be a variable that is written to a circuit register upon system power up.

As described above, the gain control 20 determines the transmit output power level. The gain control 20 can set the transmit power as close to the desired output power as possible without going over. Transmitting at the highest output power that does not exceed FCC limits maximizes link range. The power detect control loop that the gain control 20 is a part of should converge to the final output power as quickly as possible. In one specific embodiment, convergence within two transmit bursts can be achieved. After the second transmit burst, it is possible to change the transmit power level with very high accuracy.

Figure 3:
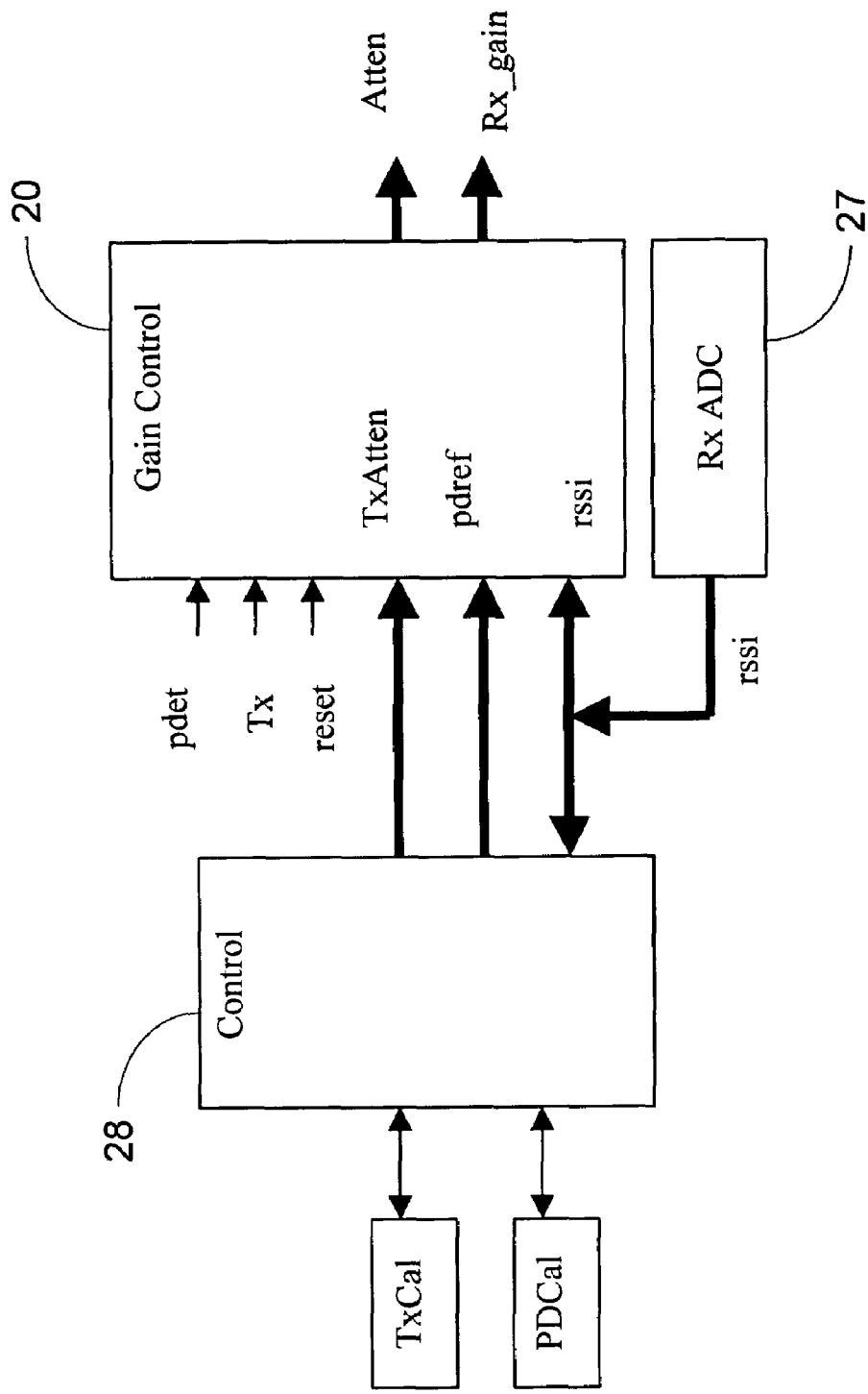
FIG. 3 shows a high-level functional block diagram of one specific embodiment of the control loop gain control and control blocks.

A high-level functional block diagram of one specific embodiment of the control loop gain control 20 and control block 28 is shown in FIG. 3. Control block 28 represents some combination of software and hardware that is used to control the radio.

Control block 28 receives reference input signals TxCal and PDCal. Transmit reference signal TxCal is a 7-bit constant that is used to calibrate the transmitter's gain. In one specific embodiment, the least significant bit (LSB) of TxCal may be 0.25 dB, and the range may be 32 dB. The power detect reference signal PDCal is a 8-bit constant that is used to calibrate the power detector. In one specific embodiment the LSB of PDCal may be 0.25 dB, and the range may be 64 dB. Different TxCal and PDCal words may be needed for each different transmission frequency band. For example, different TxCal and PDCal words may be used for ISM band and for UNII band. These constants may be stored in memory such as flash memory and loaded when the system is started up.

The TxAtten output from control block 28 to gain control 20 represents the desired amount of attenuation requested. For example, if the maximum output power allowed in a certain band is requested, TxAtten will be 0 dB. In one specific embodiment, the output power is programmable over a 56.5 dB range with 0.5 dB resolution so TxAtten is a 7-bit word. Control block 28 also outputs to gain control 20 a power control loop reference pdref, which is typically an 8-bit word (LSB=0.25 dB) that is a function of PDCal and TxAtten. The received signal strength indicator signal rssi is typically a 8-bit (LSB=0.25 dB) measure of the transmitted power. The power control loop generally, and gain control 20 specifically, minimize the difference between pdref and rssi.

The gain control 20 is initialized by the reset signal, reset. The power detect enable signal, pdet, enables the power detect circuit within the gain control 20. Transmit enable signal, Tx, enables the transmitter and clocks the gain control circuit 20.

Gain control 20 produces two outputs, Atten and Rx_gain. Atten is the transmit path attenuation that is set by the power control loop, i.e., the gain control for transmit VGA 11. For example, in one specific embodiment, Atten is a 10-bit word in which the LSB is 0.138 dB. Rx_gain is the receive-path gain signal which is used to optimize the gain of baseband VGA 26 to maximize the signal-to-noise ratio (SNR) of the detector path while preventing the control loop ADC 27 from clipping.

In some embodiments, a factory calibration may be required for the power control loop. The calibration can be performed by transmitting a signal—either the OFDM preamble or a single tone—and measuring the power. The transmit reference TxCal is determined by:

$$TxCal = P_{cal} - P_{desired} - FudgeFactor$$

where $P_{cal}$ is the measured power and $P_{desired}$ is the desired power. The FudgeFactor ensures that the output power of the first burst does not exceed the FCC limit because the frequency and temperature used during calibration mode may not result in the highest possible output power. The power detect reference PDCal is determined by:

$$PDCal = rssi_{cal} - P_{desired} + P_{cal}$$

where $rssi_{cal}$ is the rssi reading during the calibration test. It may be desirable to perform the calibration at something other than 0 dB attenuation to ensure that the transmit path is linear. In that case, TxAtten should be added to PDCal. This can be done in the test software.

Figure 4:
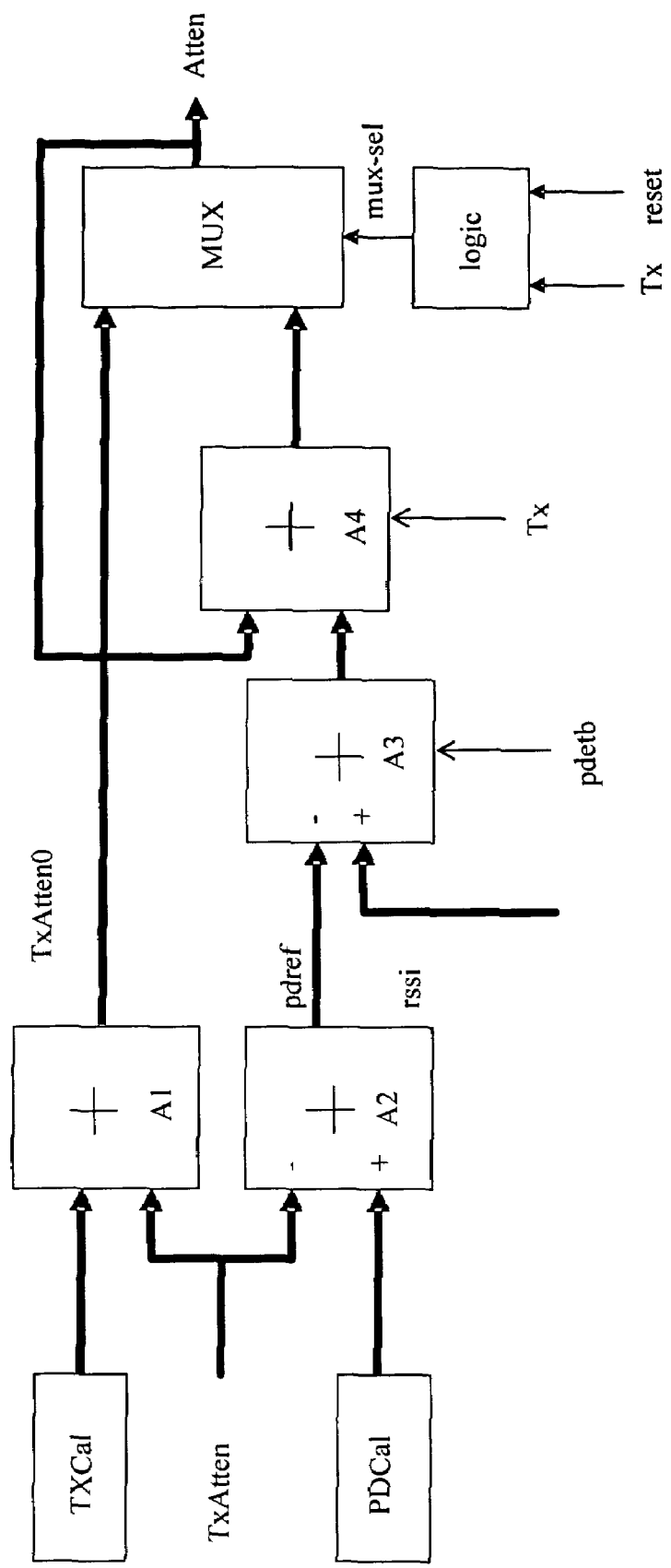
FIG. 4 shows functional blocks within the power control loop structure of FIG. 3.

FIG. 4 shows functional blocks within the power control loop structure of FIG. 3. Initially, we ignore the path along the top and determine the attenuation output from the gain control 20, Atten, during burst number n as:

$$Atten(n) = Atten(n-1) + rssi((n-1) - pdref$$
$$= Atten(n-1) + rssi(n-1) - PDCal + TxAtten$$

where pdref is the power control loop reference, which is the target rssi adjusted for the desired attenuation setting. For example, if the transmit power during burst n−1 is 2 dB too low, rssi(n−1)−pdref=−2 dB, so the Atten signal for burst n will be reduced by 2 dB. If the attenuation steps for Atten are accurate, the power level will get to the desired level (within the quantization error) on the second transmit burst.

It is possible for the desired transmit power to change from one burst to the next. Once the loop has stabilized (i.e., after the first burst) the transmitter will transmit at the correct power—even if the desired power level changes—because pdref changes if TxAtten changes. For example, if TxAtten was 0 dB but is changed to 3 dB after the end of a transmit burst, then pdref will fall by 3 dB so rssi-pdref will be 3 dB and the attenuation will increase by 3 dB.

The attenuation setting Atten for the first transmit burst (TxAtten0) is calculated differently than for subsequent bursts because there is no previous burst that can be used to measure the error. Thus, as shown along the top row of FIG. 4, the first-burst attenuation setting is TxAtten+TxCal. The multiplexer MUX at the output of gain control 20 selects between the open-loop calculation of the attenuation for the first burst and the closed-loop control for subsequent bursts. In one specific embodiment, adders A1, A2 and A2 are 8-bits wide, and A4 is a 10-bit adder.

Figure 5:
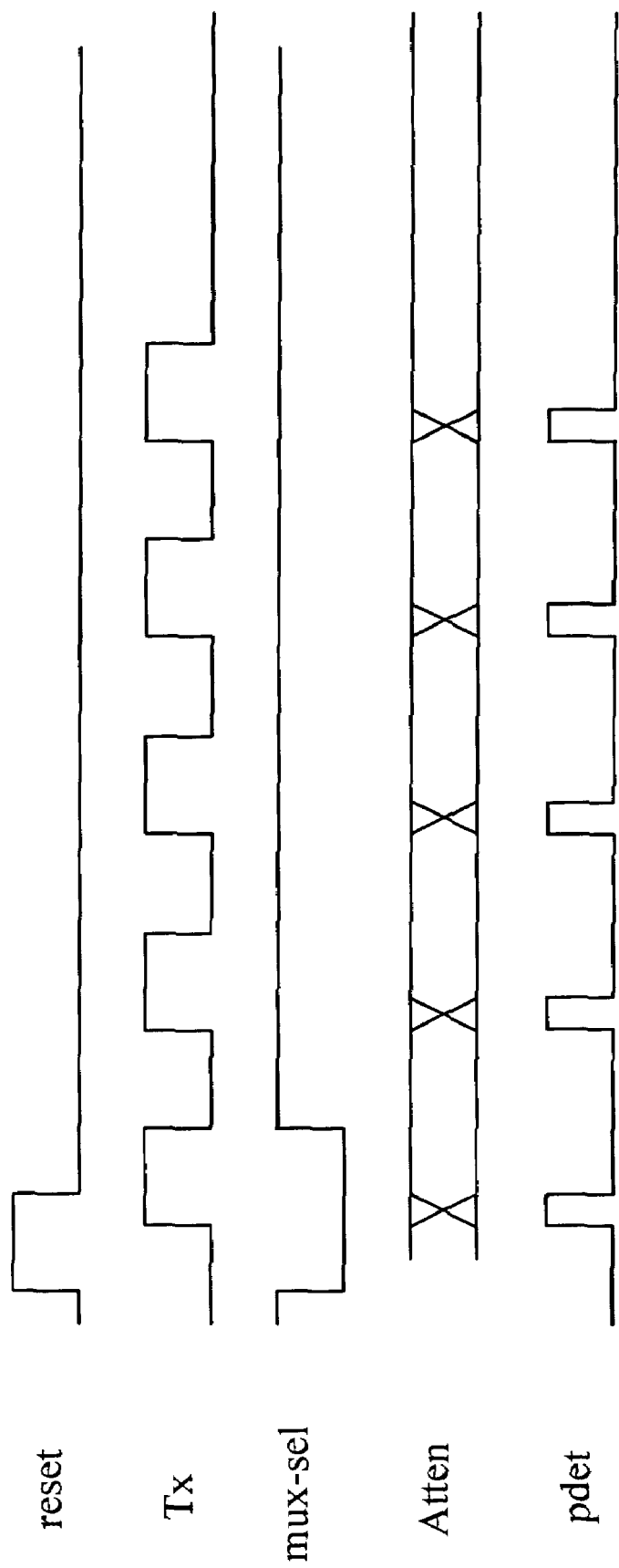
FIG. 5 shows the relative timing of some of the signals associated with the transmit power control of FIG. 5.

The timing of some of the control signals for the transmit power control in FIG. 4 are shown in FIG. 5. The load synthesizer signal reset is asserted when a new frequency channel is selected. The first burst on the new channel will use the Tx attenuation setting calculated by the feedforward path and selected by mux_sel going low. mux_sel goes high on the first falling edge of Tx after the rising edge of reset. When mux_sel is high the closed-loop power control is selected. pdet enables the power detect circuits and one of the receiver baseband channels. pdet only has to be asserted long enough to get a stable rssi reading. In one specific embodiment, it may take about 1 µsec for the rssi averaging to settle, and another 1 µsec for the receiver filter to settle.

Figure 7:
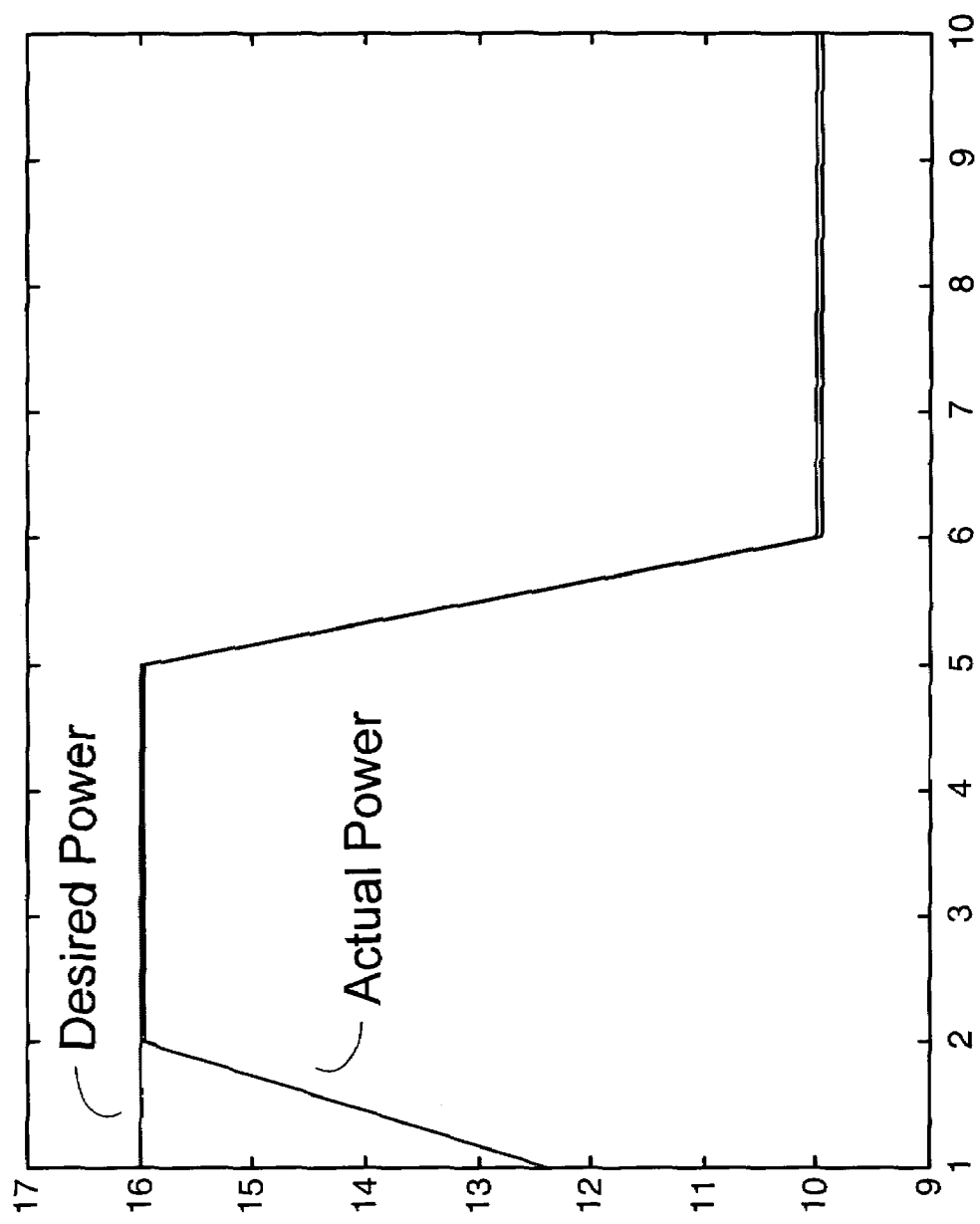
FIG. 7 shows output power and desired power versus transmit burst number in one embodiment.
Figure 8:
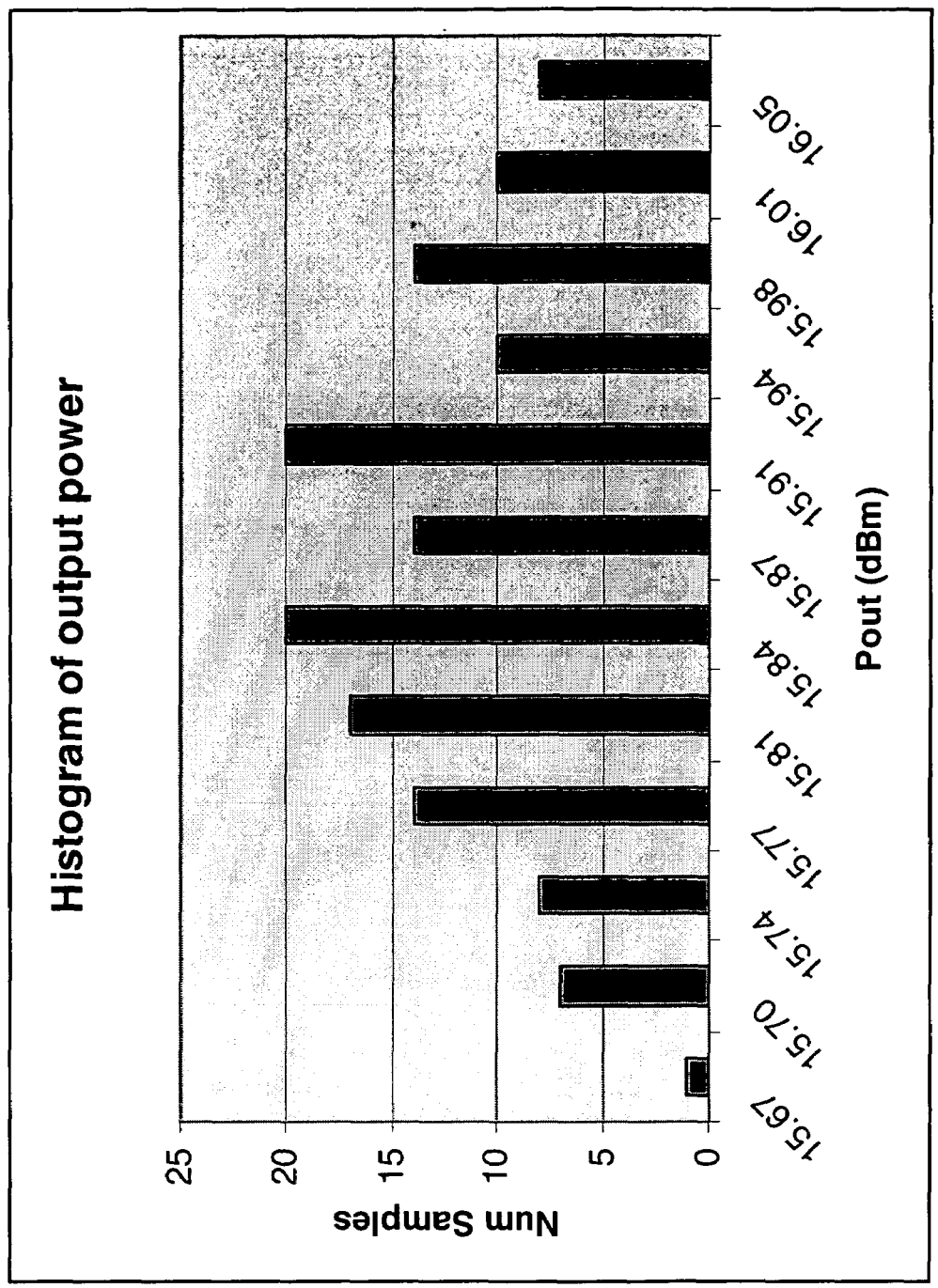
FIG. 8 shows a histogram of output power in an embodiment with 0.25 dB rssi resolution and 0.125 dB gain steps.

The basic approach described above can be verified by a simple matlab program. FIG. 7 shows the output power and the desired power versus the transmit burst number. A histogram of the output power in an embodiment with 0.25 dB rssi resolution and 0.125 dB gain steps is shown in FIG. 8. The desired power is 16 dBm for the first 5 bursts and 10 dBm for next 5 bursts. There is a significant error during the first burst since the calibration cannot account for temperature and frequency dependence. After the first burst the error is very small (limited by gain and rssi quantization) even if the desired output power changes.

The following table provides a block specification of the transmit power control function for one specific embodiment:

| Pin Name | I/O | Description |
| --- | --- | --- |
| vdd18 | S | 1.8 V supply |
| vss | S | ground and local Nwell |
| substrate (global) | S | substrate |
| tx_atten[6:0] | I | desired attenuation. LSB = 0.5 dB |

-continued

| Pin Name | I/O | Description |
| --- | --- | --- |
| txcal_lb[6:0] | I | low-band tx power calibration word. Written to SIF on power up. LSB = 0.25 dB. |
| txcal_hb[6:0] | I | high-band tx power calibration word. Written to SIF on power up. LSB = 0.25 dB |
| pdcal_lb[7:0] | I | low-band rssi calibration word. Written to SIF on power up. LSB = 0.25 dB |
| pdcal_hb[7:0] | I | high-band rssi calibration word. Written to SIF on power up. LSB = 0.25 dB |
| Rssi[7:0] | I | digital rssi output. LSB = 0.25 dB. Rx AGC uses rssi[9:2]. |
| reset | I | loads new synthesizer word and resets the power-control loop. first burst after rising edge of ld_synth uses feedforward path. |
| Tx | I | enables transmitter. atten is latched on rising edge of tx. |
| pdet | I | enables the power detector circuits and one of the RxBB paths. rssi output is latched on falling edge |
| atten[9:0] | O | Tx attenuation. 30 dB in the upconverter (2, 3 dB steps followed by 46 dB steps). 27 dB in 3 dB steps in the mixer. 2.875 dB in 0.125 dB steps in the digital multiplier preceding the DAC. |
| rx_init_gain[4:0] | I | Rx-gain setting when tx_atten_in[6:0] = 0 dB. Written to an AFE register upon power up. |
| rx_gain[4:0] | O | Rx VGA gain setting. Equal to rx_init_gain for −15 dB < tx_atten < 0, rx_init_gain +15 dB for −30 < tx_atten < −16, rx_init_gain +30 dB for −45 < tx_atten < −31. |

Although various exemplary embodiments of the invention have been disclosed, it should be apparent to those skilled in the art that various changes and modifications can be made which will achieve some of the advantages of the invention without departing from the true scope of the invention.

What is claimed is:

1. A radio transmission power control circuit for controlling transmission power of a half-duplex radio transceiver, comprising:
   a radio frequency (rf) downconverter that produces a downconverter output having a frequency equal to the frequency difference between a first downconverter input based on a transmitted signal of a radio transmitter of the half-duplex radio transceiver and a second downconverter input based on a local oscillator signal;
   a receiver baseband circuit of the half-duplex radio transceiver that alternately transmits and receives radio signals, the receiver baseband circuit operating while the half-duplex radio transceiver is receiving, to process received radio signals, and while the half-duplex radio transceiver is transmitting, to process the downconverter output to produce a power signal representative of the power of the transmitted signal; and
   a feedback control circuit that produces a transmitter gain control signal to control the transmitted signal power so as to minimize the difference between the power signal and a power reference signal representative of the desired power of the transmitted signal.

2. A circuit according to claim 1, wherein the local oscillator signal is used by the radio transmitter such that the transmitted signal has a frequency determined by the local oscillator signal.

3. A circuit according to claim 1, further comprising:
   an analog-to-digital converter that converts the power signal to a representative digital power signal; and
   wherein the feedback control circuit produces the transmitter gain control signal so as to minimize the difference between the digital power signal and the power reference signal.

4. A circuit according to claim 1, wherein the first downconverter input is developed by a directional coupler that senses the transmitted signal.

5. A circuit according to claim 1, wherein the radio transmitter is part of a wireless local area network transceiver.

6. A circuit according to claim 1, wherein the radio transmitter is part of a time division duplex system.

7. A method of controlling radio transmission power of a half-duplex radio transceiver, the method comprising:
   producing with a radio frequency (rf) downconverter a downconverter output having a frequency equal to the frequency difference between a first downconverter input based on a transmitted signal of a radio transmitter of the half-duplex radio transceiver and a second downconverter input based on a local oscillator signal;
   processing the downconverter output with a receiver baseband circuit of the half-duplex radio transceiver that alternately transmits and receives radio signals, the receiver baseband circuit operating while the half-duplex radio transceiver is receiving, to process received radio signals, and while the half-duplex radio transceiver is transmitting, to process a power signal representative of the power of the transmitted signal; and
   producing a transmitter gain control signal to control the transmitted signal power so as to minimize the difference between the power signal and a power reference signal representative of the desired power of the transmitted signal.

8. A method according to claim 7, wherein the local oscillator signal is used by the radio transmitter such that the transmitted signal has a frequency determined by the local oscillator signal.

9. A method according to claim 7, further comprising:
   converting the power signal to a representative digital power signal; and
   wherein the transmitter gain control signal is produced so as to minimize the difference between the digital power signal and the power reference signal.

10. A method according to claim 7, wherein the first downconverter input is developed by a directional coupler that senses the transmitted signal.

11. A method according to claim 7, wherein the radio transmitter is part of a wireless local area network transceiver.

12. A method according to claim 7, wherein the radio transmitter is part of a time division duplex system.

13. A radio transmission power control circuit for controlling transmission power of a half-duplex radio transceiver, comprising:
   a radio frequency (rf) quadrature downconverter that produces a quadrature downconverter output having a frequency equal to the frequency difference between a first quadrature downconverter input based on a transmitted signal of a radio transmitter of the half-duplex radio transceiver and a second quadrature downconverter input based on a local oscillator signal;
   a receiver baseband circuit of the half-duplex radio transceiver that alternately transmits and receives radio signals, the receiver baseband circuit operating while the half-duplex radio transceiver is receiving, to process received radio signals, and while the half-duplex radio transceiver is transmitting, to process the quadrature downconverter output to produce a power signal representative of the power of the transmitted signal; and a feedback control circuit that produces a transmitter gain control signal to control the transmitted signal power so as to minimize the difference between the power signal and a power reference signal representative of the desired power of the transmitted signal.

14. A circuit according to claim 13, wherein the local oscillator signal is used by the radio transmitter such that the transmitted signal has a frequency determined by the local oscillator signal.

15. A circuit according to claim 13, further comprising:
an analog-to-digital converter that converts the power signal to a representative digital power signal; and
wherein the feedback control circuit produces the transmitter gain control signal so as to minimize the difference between the digital power signal and the power reference signal.

16. A circuit according to claim 13, wherein the first quadrature downconverter input is developed by a directional coupler that senses the transmitted signal.

17. A circuit according to claim 13, wherein the radio transmitter is part of a wireless local area network transceiver.

18. A circuit according to claim 13, wherein the radio transmitter is part of a time division duplex system.

19. A method of controlling radio transmission power of a half-duplex radio transceiver, the method comprising:
producing with a radio frequency (rf) quadrature downconverter a quadrature downconverter output having a frequency equal to the frequency difference between a first quadrature downconverter input based on a transmitted signal of a radio transmitter of the half-duplex radio transceiver and a second quadrature downconverter input based on a local oscillator signal;
processing the quadrature downconverter output with a receiver baseband circuit of the half-duplex radio transceiver that alternately transmits and receives radio signals, the receiver baseband circuit operating while the half-duplex radio transceiver is receiving, to process received radio signals, and while the half-duplex radio transceiver is transmitting, to process a power signal representative of the power of the transmitted signal; and
producing a transmitter gain control signal to control the transmitted signal power so as to minimize the difference between the power signal and a power reference signal representative of the desired power of the transmitted signal.

20. A method according to claim 19, wherein the local oscillator signal is used by the radio transmitter such that the transmitted signal has a frequency determined by the local oscillator signal.

21. A method according to claim 19, further comprising:
converting the power signal to a representative digital power signal; and wherein the transmitter gain control signal is produced so as to minimize the difference between the digital power signal and the power reference signal.

22. A method according to claim 19, wherein the first quadrature downconverter input is developed by a directional coupler that senses the transmitted signal.

23. A method according to claim 19, wherein the radio transmitter is part
of a wireless local area network transceiver.

24. A method according to claim 19, wherein the radio transmitter is part of a time division duplex system.

* * * * *